United States Patent
Masuduzzaman et al.

(10) Patent No.: US 11,776,634 B2
(45) Date of Patent: Oct. 3, 2023

(54) PULSED BIAS FOR POWER-UP OR READ RECOVERY

(71) Applicant: Western Digital Technologies, Inc., San Jose, CA (US)

(72) Inventors: Muhammad Masuduzzaman, Chandler, AZ (US); Deepanshu Dutta, Fremont, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 161 days.

(21) Appl. No.: 17/358,927

(22) Filed: Jun. 25, 2021

(65) Prior Publication Data
US 2022/0415406 A1 Dec. 29, 2022

(51) Int. Cl.
| | | |
|---|---|---|
| *G11C 11/34* | (2006.01) | |
| *G11C 16/26* | (2006.01) | |
| *G11C 16/04* | (2006.01) | |
| *G11C 16/34* | (2006.01) | |
| *G11C 16/08* | (2006.01) | |
| *G11C 11/56* | (2006.01) | |

(52) U.S. Cl.
CPC .......... *G11C 16/26* (2013.01); *G11C 16/0483* (2013.01); *G11C 16/08* (2013.01); *G11C 16/349* (2013.01); *G11C 11/5671* (2013.01)

(58) Field of Classification Search
CPC ..... G11C 16/10; G11C 11/5628; G11C 16/12; G11C 16/0483; G11C 16/3454
USPC ........................................ 365/185.19, 185.18
See application file for complete search history.

(56) References Cited

U.S. PATENT DOCUMENTS

| | | | |
|---|---|---|---|
| 8,437,193 B1 | 5/2013 | Yang | |
| 8,902,669 B2 | 12/2014 | Yang et al. | |
| 9,899,065 B1 * | 2/2018 | Lee .......................... | G11C 7/04 |
| 10,020,052 B2 | 7/2018 | Kwon | |

(Continued)

OTHER PUBLICATIONS

Mizoguchi, K. et al. "Automatic Data Repair Overwrite Pulse for 3D-TLC NAND Flash Memories with 38x Data-retention Lifetime Extension", Department of Electrical, Electronic, and Communication Engineering, Chuo University, Tokyo, JP, 2019, IEEE International Reliability Physics Symposium, IRPS, IEEE, 5 total pages.

(Continued)

*Primary Examiner* — Son T Dinh
(74) *Attorney, Agent, or Firm* — ARENTFOX SCHIFF LLP

(57) ABSTRACT

A storage device is provided that applies pulsed biasing during power-up or read recovery. The storage device includes a memory and a controller. The memory includes a block having a word line and cells coupled to the word line. The controller applies a voltage pulse to the word line during power-up or in response to a read error. The voltage pulse may include an amplitude and a pulse width that are each a function of a number of P/E cycles of the block. The controller may also perform pulsed biasing during both power-up and read recovery by applying one or more first voltage pulses to the word line during power-up and one or more second voltage pulses to the word line in response to a read error. As a result, lower bit error rates due to wider Vt margins may occur and system power may be saved over constant biasing.

20 Claims, 17 Drawing Sheets

(56) References Cited

U.S. PATENT DOCUMENTS

2021/0175888 A1* 6/2021 McLaury .......... H03K 19/1776

OTHER PUBLICATIONS

Cai, Yu et al., "Data Retention in MLC NAND Flash Memory: Characterization, Optimization, and Recovery", Carnegie Mellon University, LSI Corporation, 2015, IEEE 21st International Symposium on High Performance Computer Architecture (HPCA), IEEE, 13 total pages.

Wang, Wei et al., "Reducing MLC Flash Memory Retention Errors through Programming Initial Step Only", 2015, 31st Symposium on Mass Storage Systems and Technologies (MSST), IEEE, 8 total pages.

* cited by examiner

PULSED BIAS FOR POWER-UP OR READ RECOVERY

BACKGROUND

Field

This disclosure is generally related to electronic devices and more particularly to storage devices.

INTRODUCTION

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

Flash storage devices may program and read data in cells of a block of flash memory. However, between the times that a cell is programmed and read, electric charge stored in the cell may be lost. For example, electrons within a charge trapping layer (CTL) of the cell may migrate through a blocking oxide layer (BLK) or a tunnel oxide layer (TNL) of the cell, leading to cell charge loss. This charge loss may in turn result in bit errors when the flash storage device later attempts to read the cell, thereby impacting the data retention (DR) of the cell or block.

SUMMARY

One aspect of a storage device is disclosed herein. The storage device includes a memory and a controller. The memory includes a block, and the block has a word line and a plurality of cells coupled to the word line. The controller is configured to apply a voltage pulse to the word line during power-up.

Another aspect of a storage device is disclosed herein. The storage device includes a memory and a controller. The memory includes a block, and the block has a word line and a plurality of cells coupled to the word line. The controller is configured to apply a voltage pulse to the word line in response to a read error. The voltage pulse includes an amplitude and a pulse width that are each a function of a number of program/erase (P/E) cycles of the block.

A further aspect of a storage device is disclosed herein. The storage device includes a memory and a controller. The memory includes a block, and the block has a word line and a plurality of cells coupled to the word line. The controller is configured to apply one or more first voltage pulses to the word line during power-up, and to apply one or more second voltage pulses to the word line in response to a read error.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
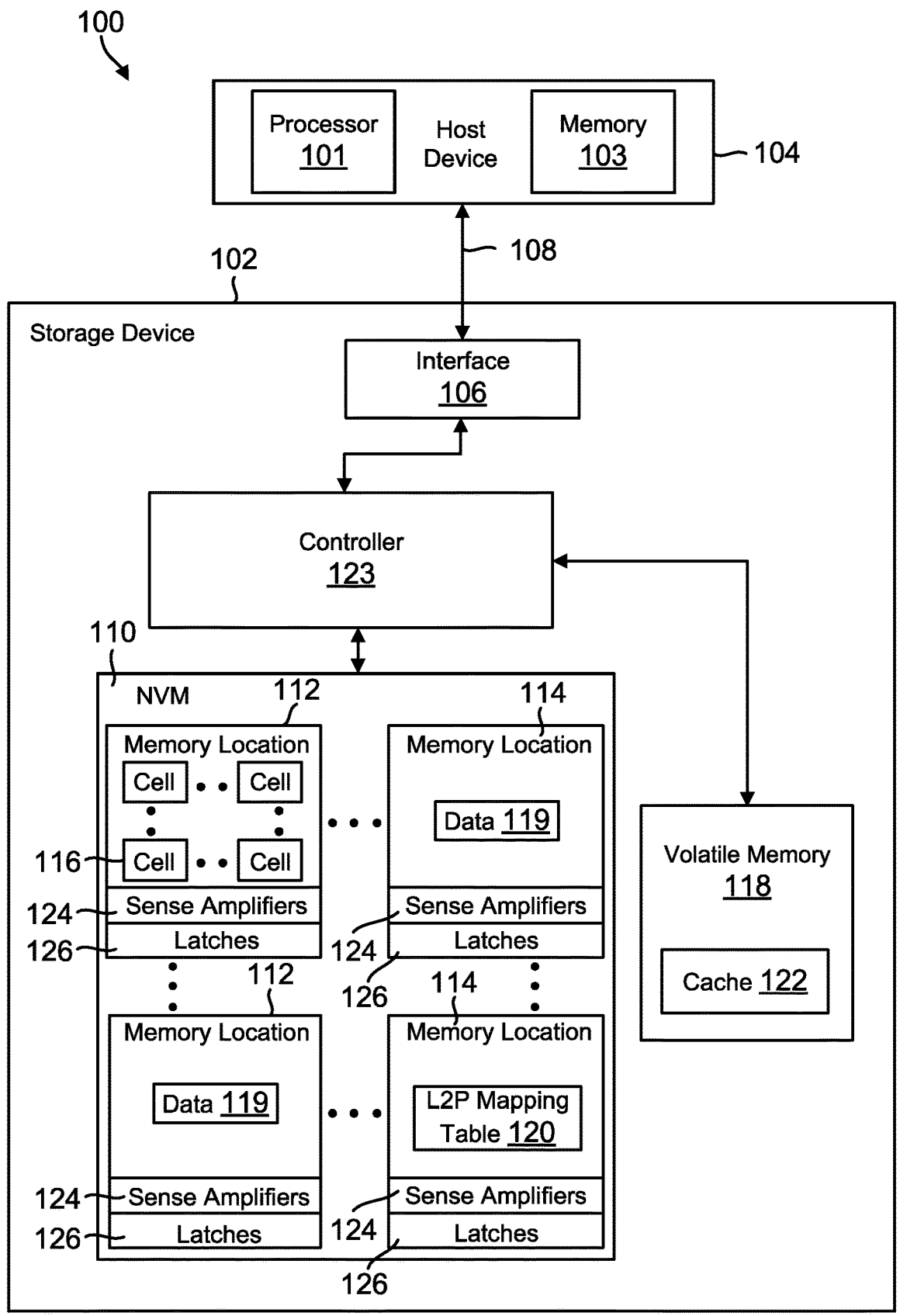
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs, SD cards, and universal serial bus (USB) flash devices. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Flash storage devices may experience charge loss in cells and reduced DR. For example, electrons in the CTL of a cell may migrate through either the BLK or the TNL of the cell, thus reducing the voltage threshold (Vt) of the cell and in turn leading to read errors. Generally, cells with median Vts across a Vt distribution for a given program state (referred to here as median or majority cells), as well as cells with Vts at the upper tail end of the Vt distribution (referred to here as upper tail cells) experience charge loss through the BLK. As a result, if a positive bias or voltage is applied to a gate of a median or upper tail cell, the rate of charge loss may increase, leading to more Vt loss and reduced DR for that cell. In contrast, cells with Vts at the lower tail end of the Vt distribution (referred to here as lower tail cells) experience charge loss through the TNL, which is opposite in direction to the BLK. As a result, if a positive bias is applied to a gate of a lower tail cell, the rate of charge loss may decrease, leading to less Vt loss and increased or maintained DR for that cell. Therefore, when a positive bias is applied to lower tail, median, and upper tail cells of a block at the same time (e.g., on a same word line), the Vt distribution of the cells sharing a given program state may narrow or tighten due to the difference in Vt changes between the cells. Similarly, other Vt distributions for other program states may also narrow, resulting in larger or increased Vt margins between different program states. For instance, applying a 4 V bias to cells on a word line may result in an increased Vt margin of approximately 400 mV (or in other words, Vt distributions in adjacent program states may be separated by an additional 400 mV). As a result of the increased margin, less or no Vt overlap between program states may result, resulting in fewer bit errors.

However, while constantly applying a bias to word lines of various blocks may improve the DR of the cells through increased Vt margin between the Vt distributions of different program states, this constant application of voltage may inefficiently lead to increased power consumption. For instance, constantly applying a positive bias to word lines of numerous blocks between host commands (e.g., while the flash storage device is not programming or reading data) may result in higher currents (e.g., Icc) and consume significant power of the flash storage device. Moreover, flash storage devices may be categorized as either power-on devices (e.g., devices which are constantly supplied power from a host, such as an SSD integrated in a desktop, laptop, etc.) or power-off devices (e.g., devices which may be removable from a host and in turn loses host supplied power, such as a USB flash device). Such power-off devices may be differentiated from power-on devices incorporating a sleep mode, e.g., where power may still be supplied from the host during the sleep mode. Therefore, while power-on devices may benefit from constant biasing due to an uninterrupted supply of power from the host, power-off devices may not be able to utilize such constant biasing as a result of their disconnect able nature. As a result, constant application of voltage to power-off devices may further lead to inefficiently increased power consumption.

Accordingly, to save system power in power-off devices while maintaining at least a portion of the DR benefit obtained through constant biasing, the flash storage device of the present disclosure may apply pulsed biasing to word lines of blocks during power-up. For instance, during initialization of the flash storage device following removal of the flash storage device from host-supplied power (e.g., unplugging from the host) and re-attachment to host-supplied power (e.g., plugging back in to the host), a controller of the flash storage device may apply a voltage pulse to one or more word lines in one or more blocks in flash memory. The controller may also apply additional voltage pulse(s) to the word line(s) following power-up or initialization until execution of a host command. The controller may configure each voltage pulse with a pulse amplitude and a pulse width that provides optimal Vt margin improvement. For example, the controller may apply a 7 V pulse over 1 second to obtain 100 mV in additional Vt margin (DR benefit) between program state voltage distributions in a given block. While such Vt margin improvement may be smaller than that resulting from constant biasing (e.g., 100 mV<400 mV in the prior example), the significant power savings of pulsed biasing compared to constant biasing may compensate for this partial improvement.

Moreover, to further save system power in power-on devices compared to constant biasing, as well as in power-off devices outside of power-up, the flash storage device of the present disclosure may apply pulsed biasing to a word line of a block during read recovery. Typically in read recovery, flash storage devices apply different read voltages in response to read errors (also referred to as read failures). For instance, if a flash storage device applies a read voltage to a word line of cells to read data, but due to threshold voltage changes from cell charge losses, incorrect bits are read which may not be correctable using standard error correction capabilities (e.g., a read error or failure is detected), the flash storage device typically applies a different read voltage to that word line in attempt to compensate for the threshold voltage changes in the cells. However, in the pulsed bias read recovery process described in the present disclosure, the controller of the flash storage device here applies a voltage pulse to the word line in response to the read failure, and then afterwards applies the same read voltage to the word line in attempt to read the data correctly in the cells. This retry read may be successful if the Vt margin improvement resulting from the voltage pulse sufficiently compensates for the Vt distribution overlap between program states that caused the read failure. If the retry read is not successful (not enough Vt margin was added from the last pulse), the controller may apply another pulse followed by another retry read, and continue accordingly until the data is successfully read. The controller may also configure each voltage pulse with a pulse amplitude and a pulse width that provides optimal Vt margin improvement, such as described above with respect to the power-up approach.

Furthermore, when a controller in a power-on device or power-off device applies pulsed biasing during power-up or read recovery, the pulse amplitude and the pulse width of the voltage pulse applied to a given block may each be a function of the number of program/erase cycles (P/E) of that block. For example, during power-up or read recovery, the controller may increase the amplitude or pulse width of a pulse applied to word lines in blocks having more P/E cycles, while the controller may decrease the amplitude or pulse width of a pulse applied to word lines blocks having less P/E cycles. Higher pulse amplitudes or longer pulse widths may compensate for the greater amount of cell charge loss, and thus longer Vt margins, in blocks having more P/E cycles than in blocks having less P/E cycles. Moreover, the controller may apply multiple voltage pulses to a word line in order to obtain further Vt margin improvement during power-up or read recovery, and each of these pulses may similarly include a pulse amplitude and a pulse width that are each a function of the number of P/E cycles of a given block.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
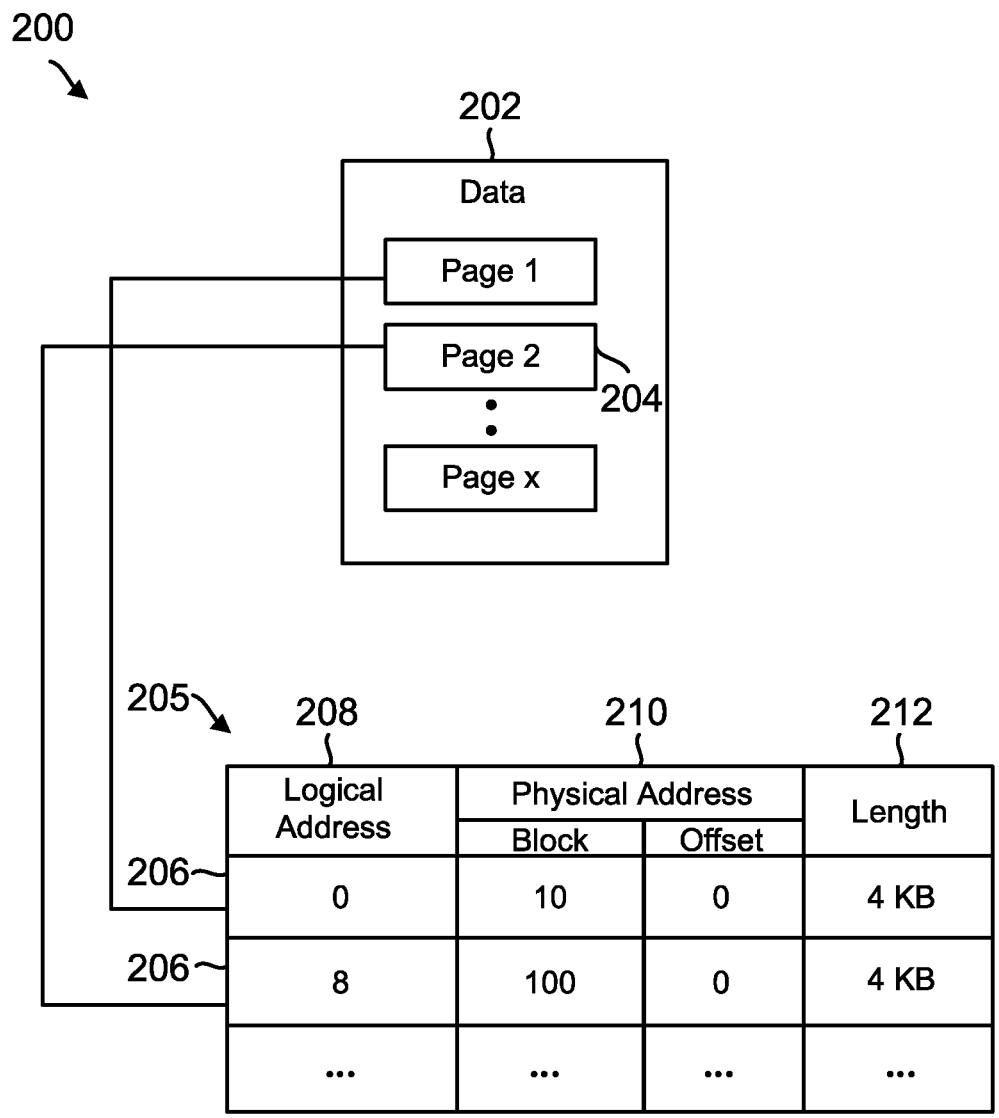
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physi- cally written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
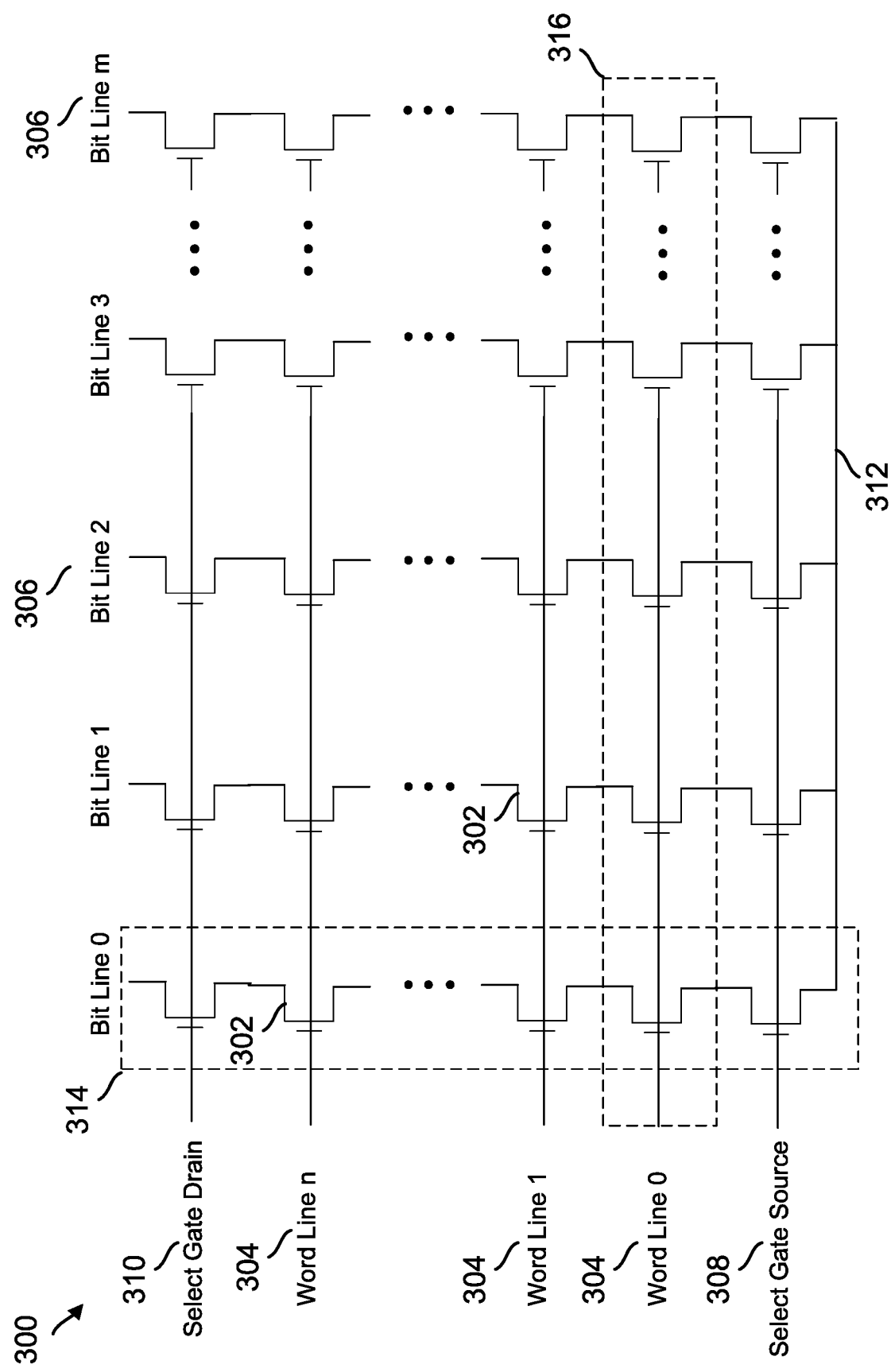
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
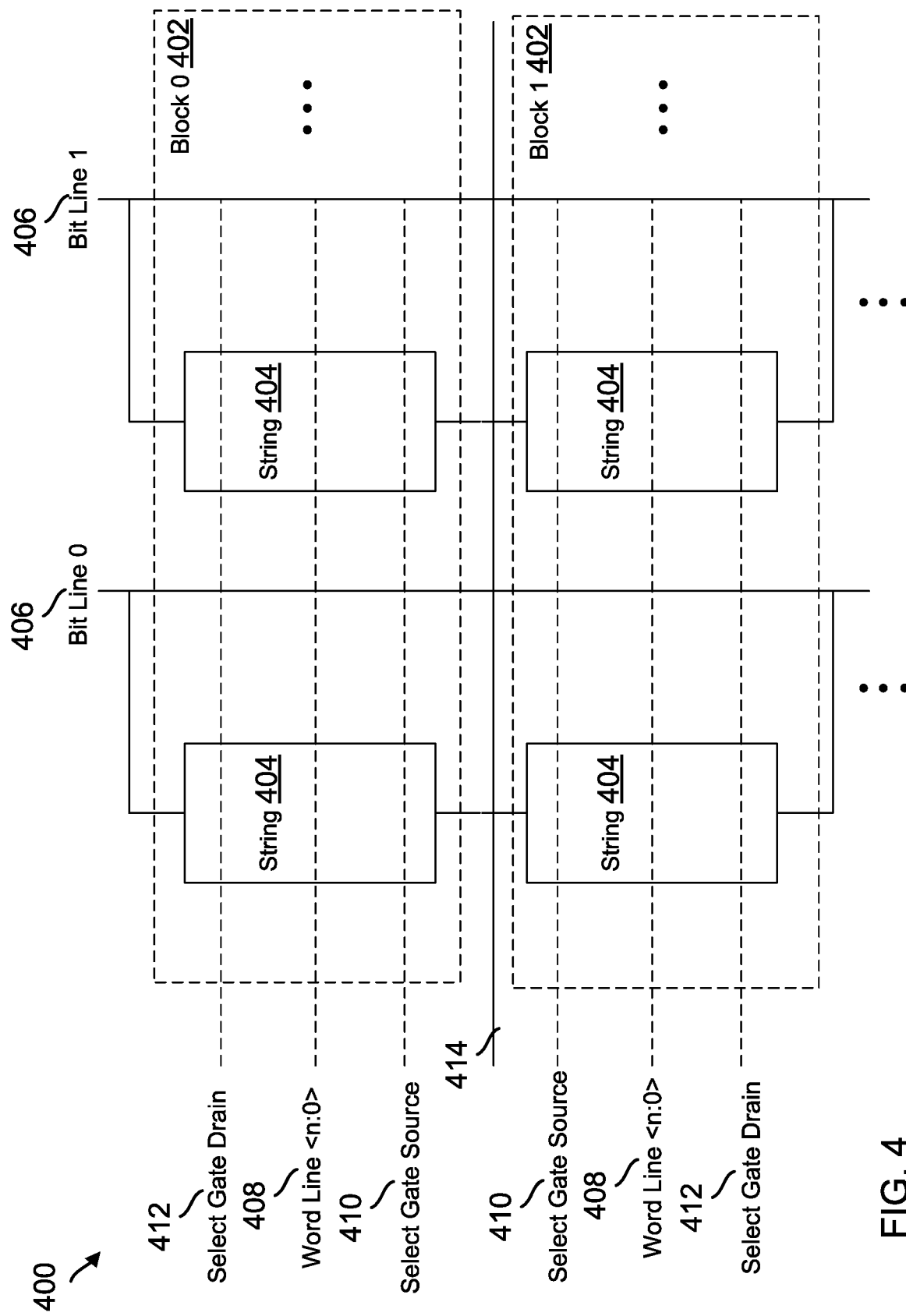
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. In one example, when programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming). Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
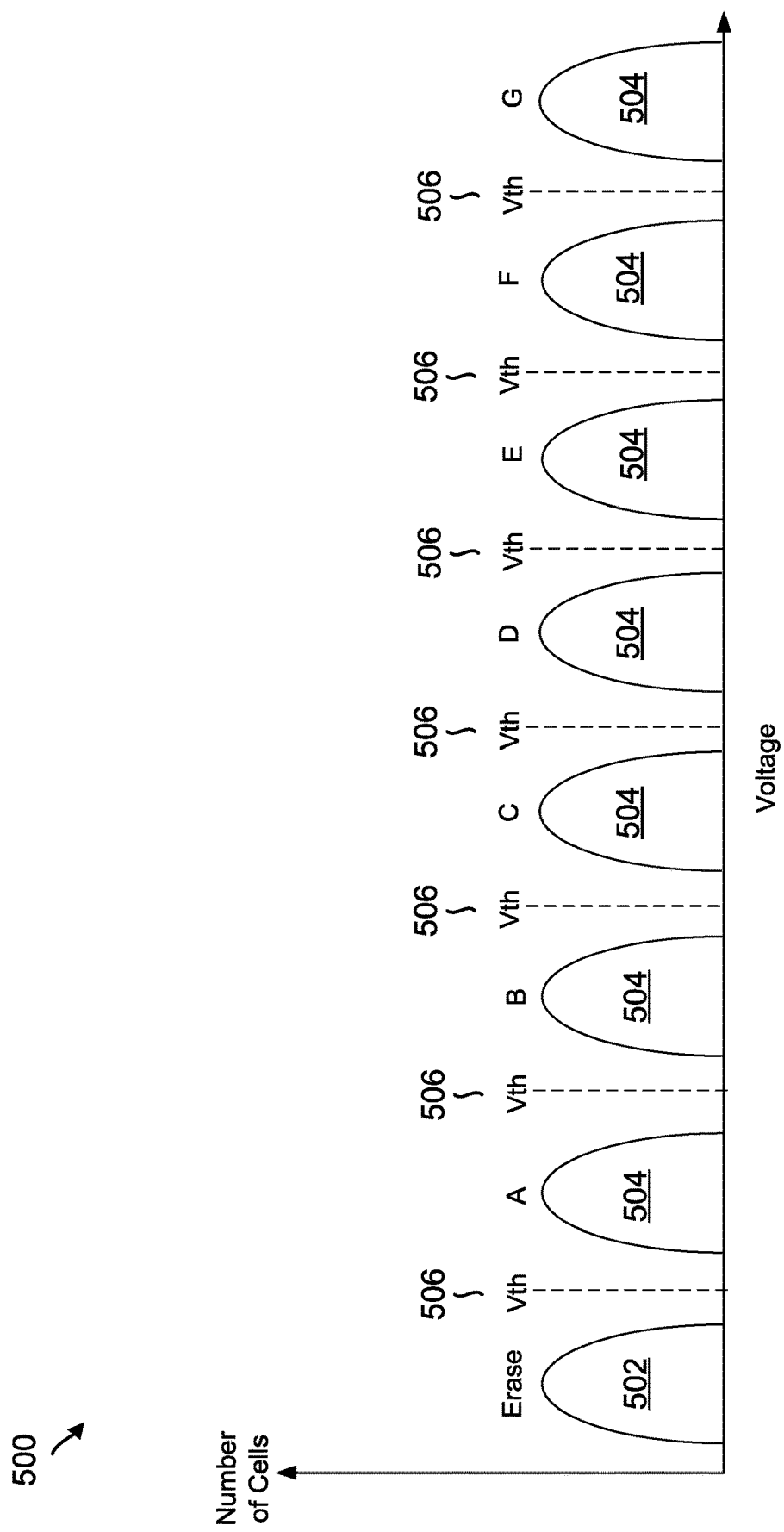
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

Figure 6A:
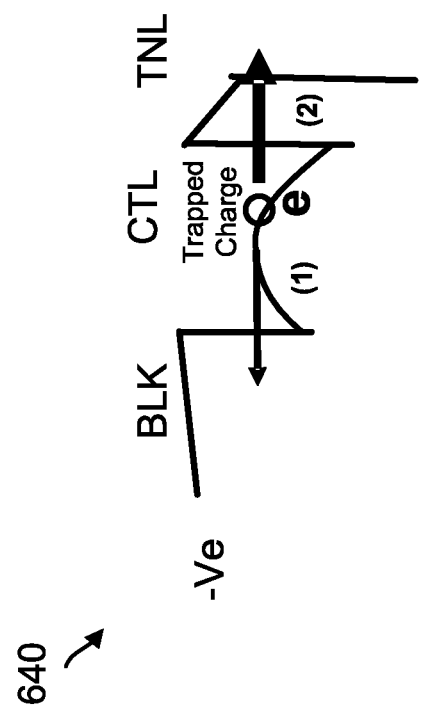
FIGS. 6A-6C are conceptual diagrams illustrating examples of charge loss in a cell in a neutral state, with an applied positive bias, and with an applied negative bias, respectively.

Over time, cells 116, 302 may experience charge loss, and thus reduction of threshold voltages 506, due to migration or de-trapping of electrons from the charge trapping layer (CTL) of the cells. The migration may occur in the direction of a blocking oxide layer (BLK) of a cell or in the direction of a tunnel oxide layer (TNL) of a cell. For instance, FIG. 6A illustrates an example 600 of charge that may leave the CTL either in direction (1) through the BLK or in direction (2) through the TNL when the cells are in a neutral state (without an applied bias). Moreover, the rate of charge migration may accelerate or decelerate in a given direction (BLK or TNL) depending on whether a positive or negative bias is applied to the cells. For example, if a positive bias is applied to the gate of the cells, direction (1) may be dominant, while if a negative bias is applied to the gate of the cells, direction (2) may be dominant for these cells. For instance, FIG. 6B illustrates an example 620 of charge that migrates from the CTL through the BLK predominantly in direction (1) in response to an applied positive bias Ve, while FIG. 6C illustrates an example 640 of charge that migrates from the CTL through the TNL predominantly in direction (2) in response to an applied negative bias −Ve.

Figure 6B:
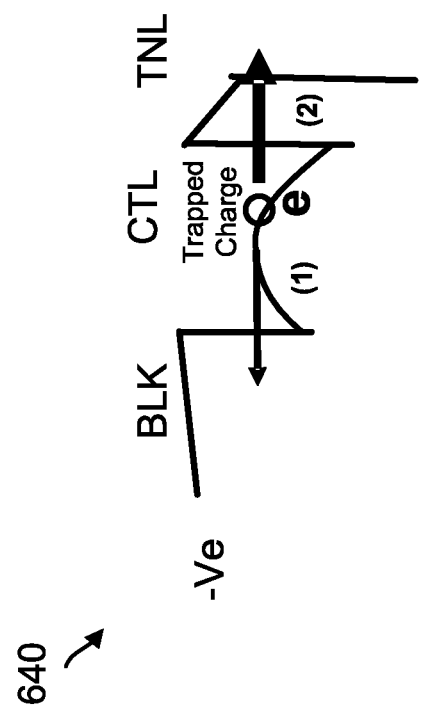
Figure 6C:
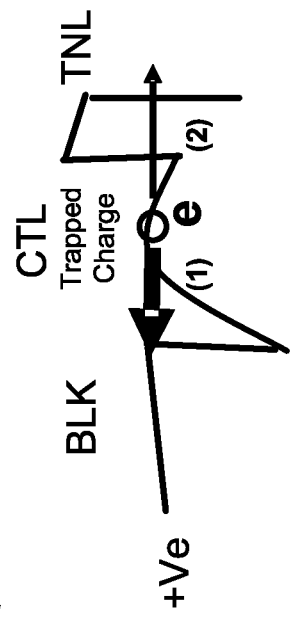
Figure 7:
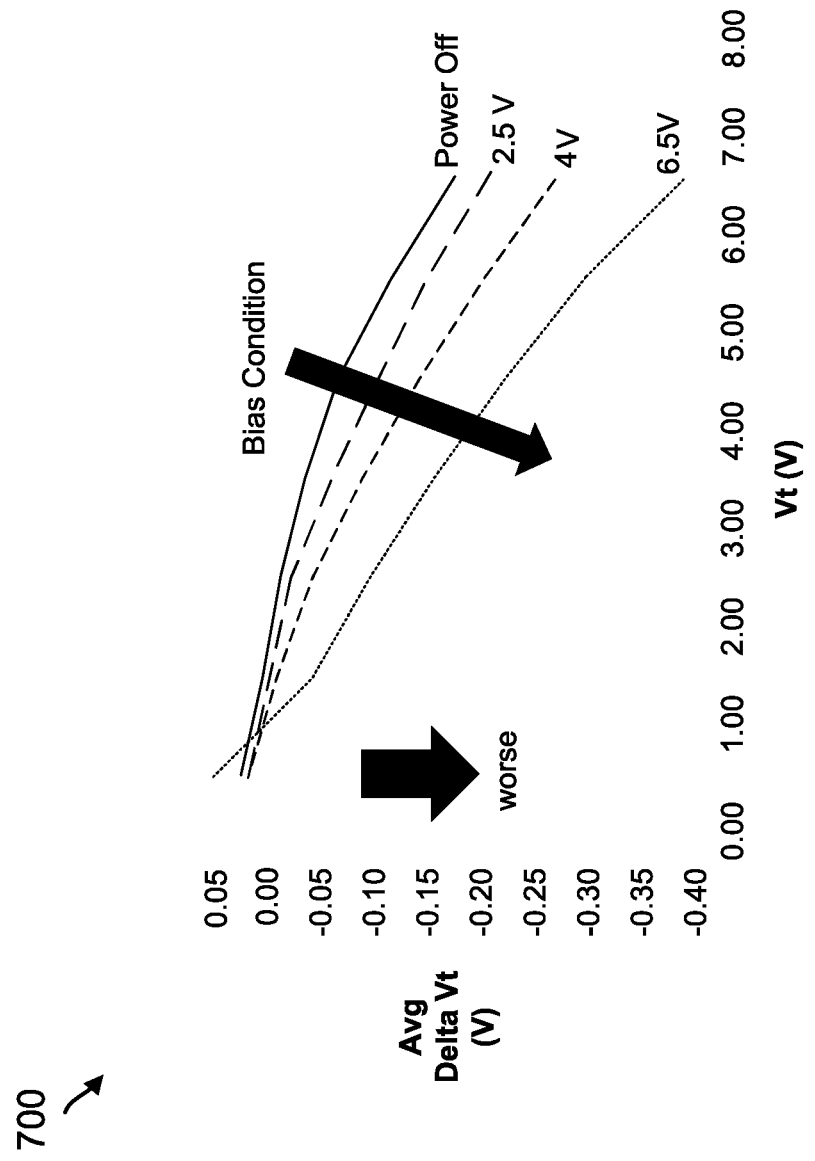
FIG. 7 is a graphical diagram illustrating examples of average drops in cell voltage thresholds in response to different positive biases applied to the cells.

FIG. 7 depicts a graph 700 showing examples of average drops in cell voltage thresholds (e.g., the threshold voltages 506 of FIG. 5) in response to different positive biases applied to the cells (e.g., Ve in FIG. 6B). For instance, the average change (delta) in Vt in the various cells monotonously decreases from the neutral state across the Vts for different positive bias conditions (e.g., 2.5 V bias, 4 V bias, and 6.5 V bias). The illustrated results corroborate the expectation that median cells may discharge through direction (1) in response to an applied positive bias, as referenced in FIG. 6B.

Figure 8:
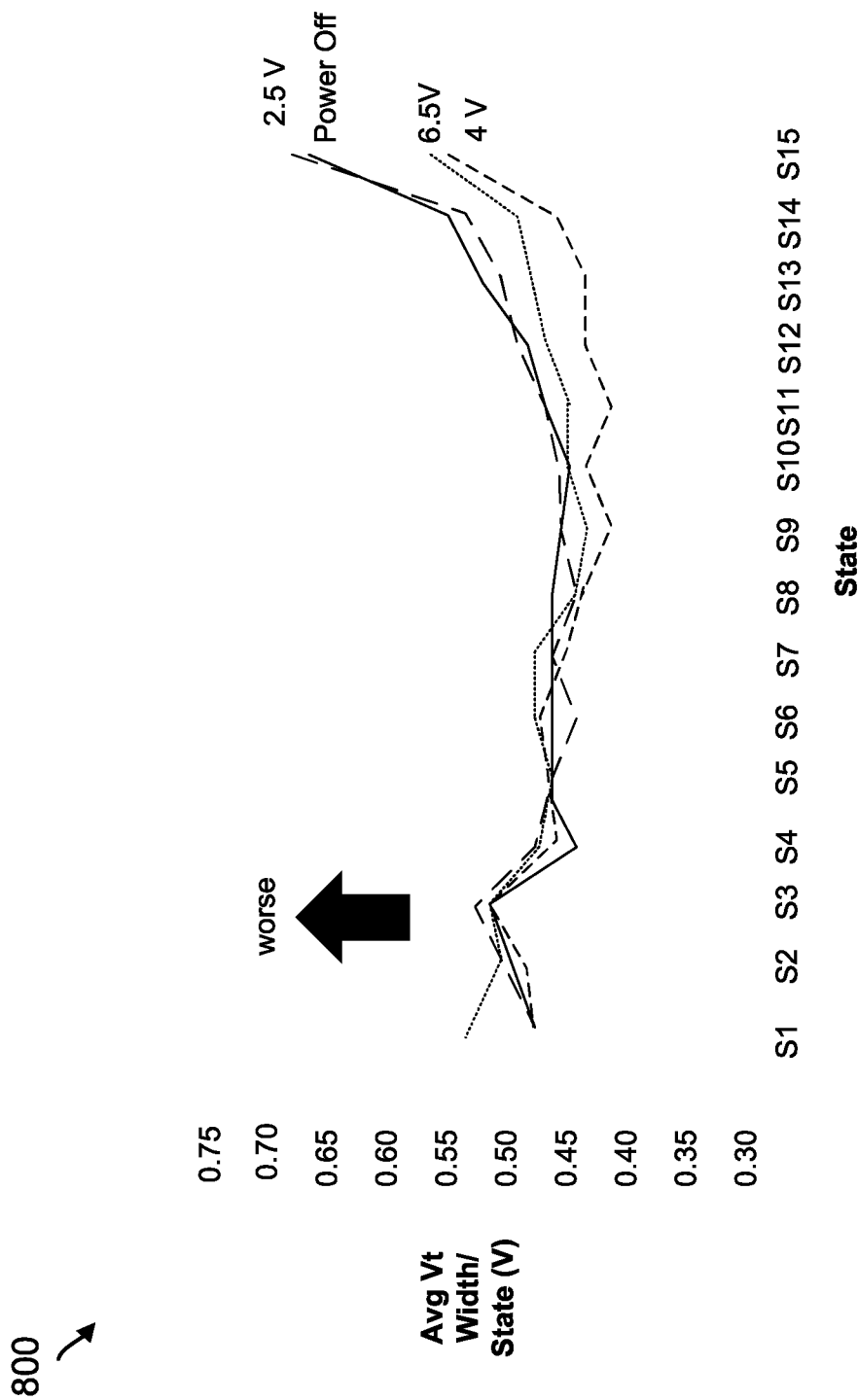
FIG. 8 is a graphical diagram illustrating examples of average cell voltage threshold widths for different program states in response to different positive biases applied to the cells.

Nevertheless, even though the Vt of the median cells may degrade at an accelerated rate in response to an applied positive bias, the average Vt distribution width may tighten and thus improve the margin between program state distributions. For instance, FIG. 8 depicts a graph 800 showing that the average cell Vt width for different program states may decrease from that of a neutral/power off state (i.e., tighten) in response to an applied positive bias. These results indicate that the median cells, or the cells occupying the majority of the Vt distribution for those states, and the lower tail cells, which occupy a minority of the Vt distribution for those states, discharge in different directions from the CTL. That is, since the median cells are understood to discharge in direction (1) towards the BLK in response to a positive bias as described above in FIGS. 6B and 7, the lower tail cells would discharge in the opposite direction (2) towards the TNL.

Figure 9:
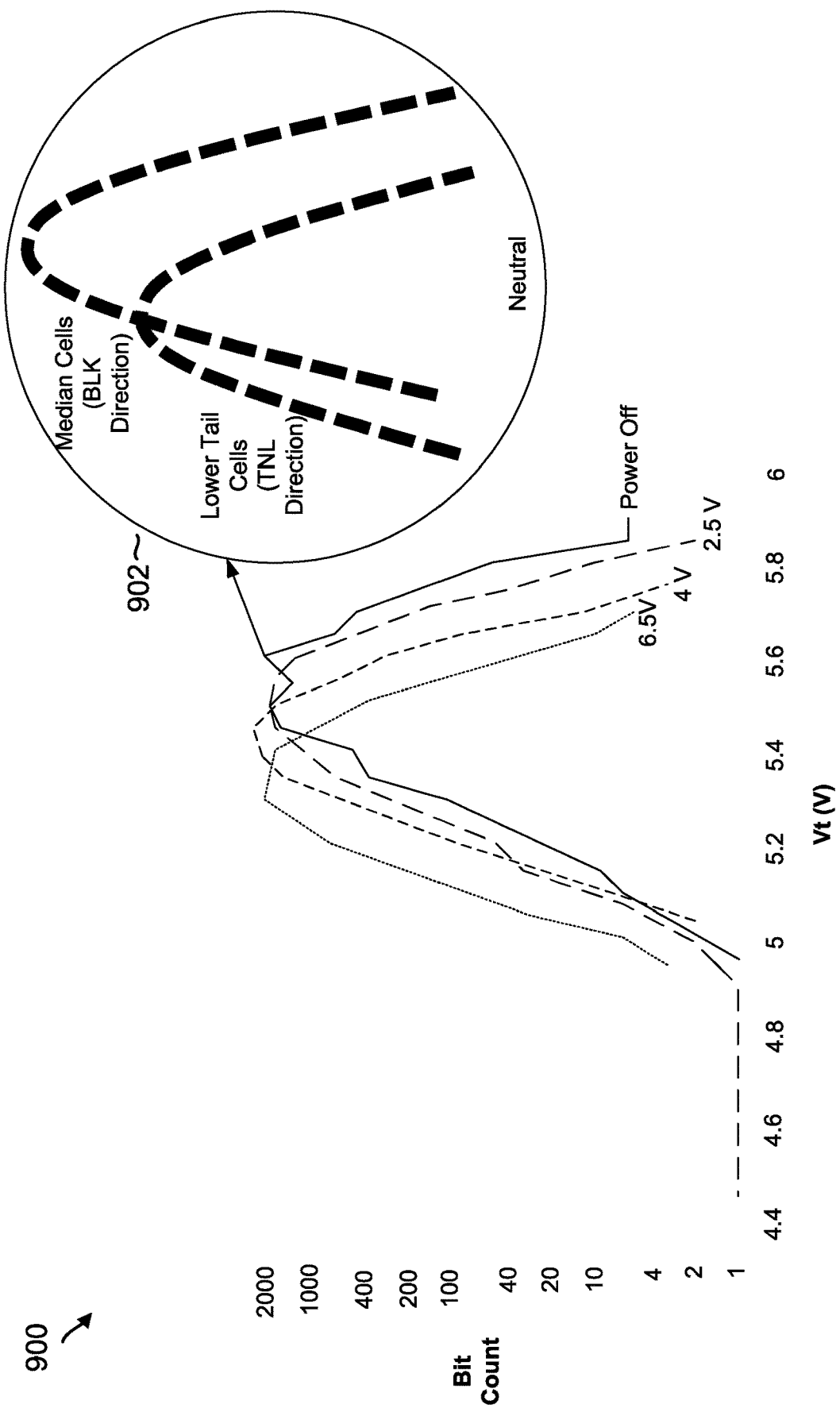
FIG. 9 is a graphical diagram illustrating examples of cell voltage threshold distributions for different positive biases applied to the cells.

FIG. 9 depicts a graph 900 showing an example of Vt distributions for cells in a given program state in response to different bias conditions. Each Vt distribution for a given bias condition may be considered to have multiple component distributions, such as illustrated at 902. For instance, FIG. 9 illustrates two component distributions of neutral state Vts, one including the Vts of median cells that discharge in the BLK direction (1), and another including the Vts of lower tail cells which discharge in the TNL direction (2). These distributions may shift differently depending on whether a positive or negative bias is applied, such as illustrated in FIGS. 10 and 11, respectively.

Figure 10:
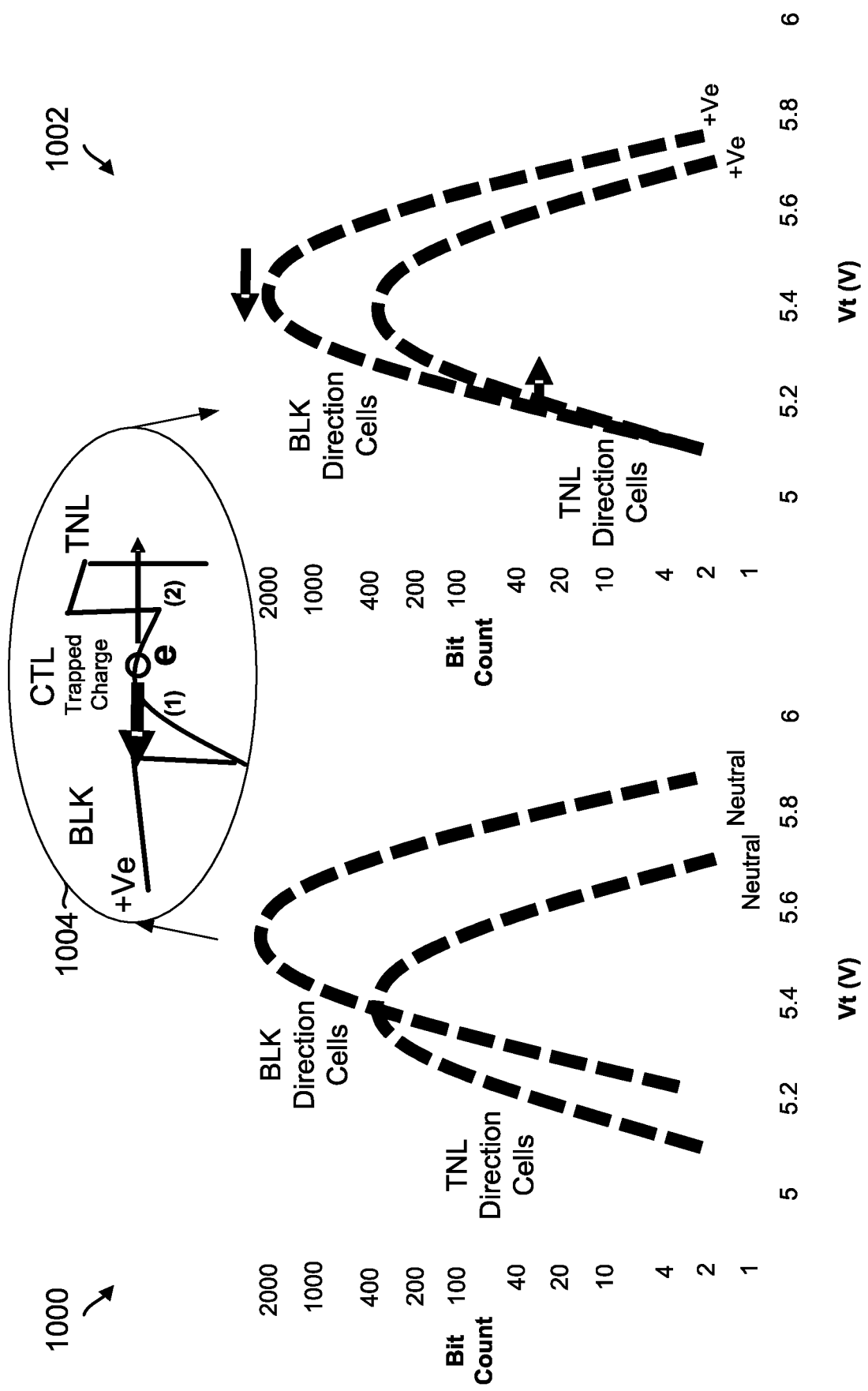
FIG. 10 is a graphical diagram illustrating an example of a median and lower tail shift in the cell voltage distribution of FIG. 9 in response to a positive bias applied to the cells.
Figure 11:
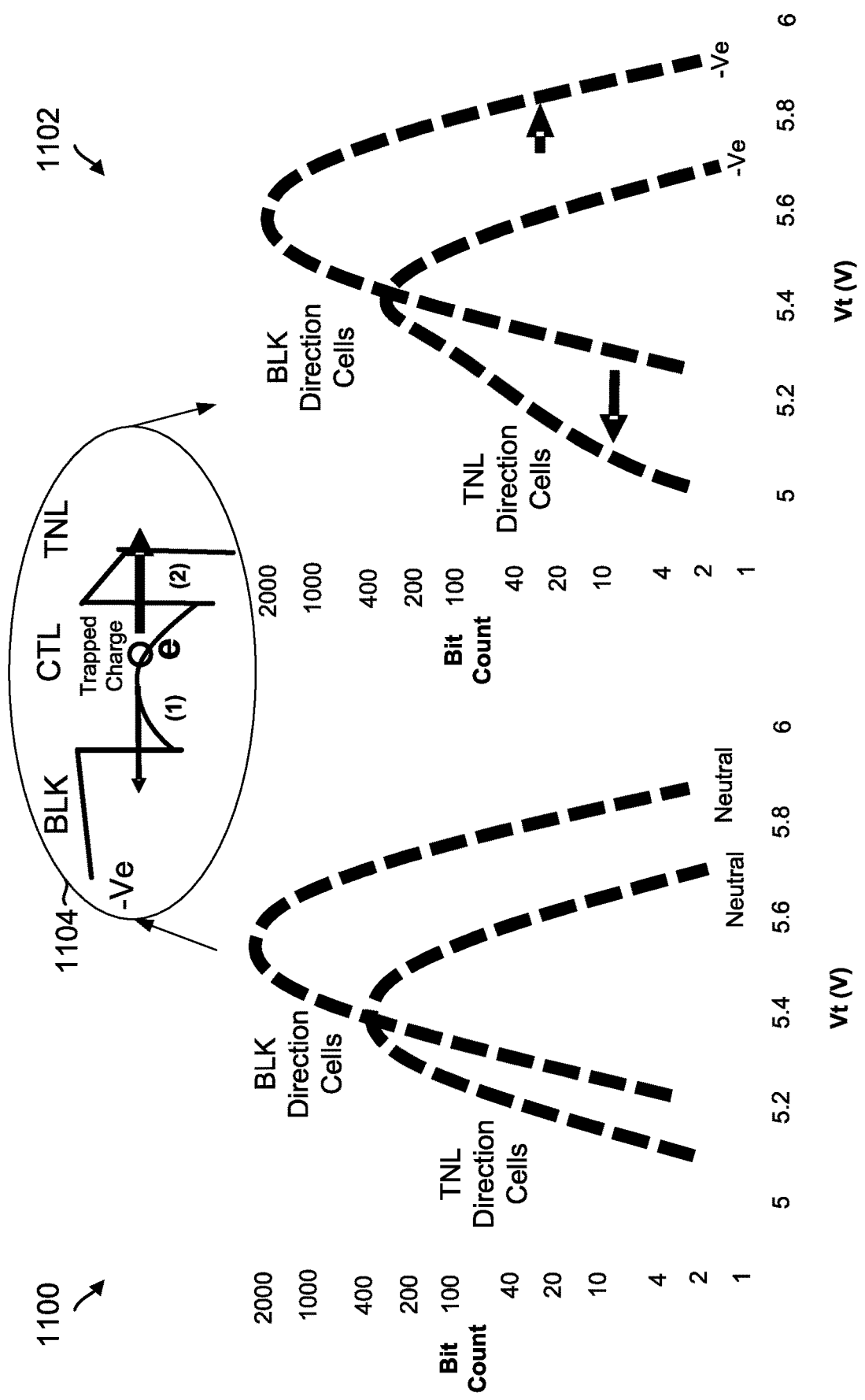
FIG. 11 is a graphical diagram illustrating an example of a median and lower tail shift in the cell voltage distribution of FIG. 9 in response to a negative bias applied to the cells.

For instance, FIG. 10 illustrates examples of graphs 1000, 1002 showing a change in the component Vt distributions of the power off curve of FIG. 9 in response to an applied positive bias Ve, as illustrated at 1004 and similarly in FIG. 6B. Here, when a positive bias is applied to the cells, the Vts of the BLK direction cells may decrease (i.e., shift left on the graph 1002 with respect to graph 1000) while the Vt of the TNL direction cells may slightly increase (i.e., shift right on the graph 1002 with respect to graph 1000). Moreover, FIG. 11 illustrates examples of graphs 1100, 1102 showing a change in the component Vt distributions of the power off curve of FIG. 9 in response to an applied negative bias −Ve, as illustrated at 1104 and similarly in FIG. 6C. Here, when a negative bias is applied to the cells, the Vt of the BLK direction cells may increase (i.e., shift right on the graph 1102 with respect to graph 1100) while the Vt of the TNL direction cells may slightly decrease (i.e., shift left on the graph 1102 with respect to graph 1100).

Figure 12:
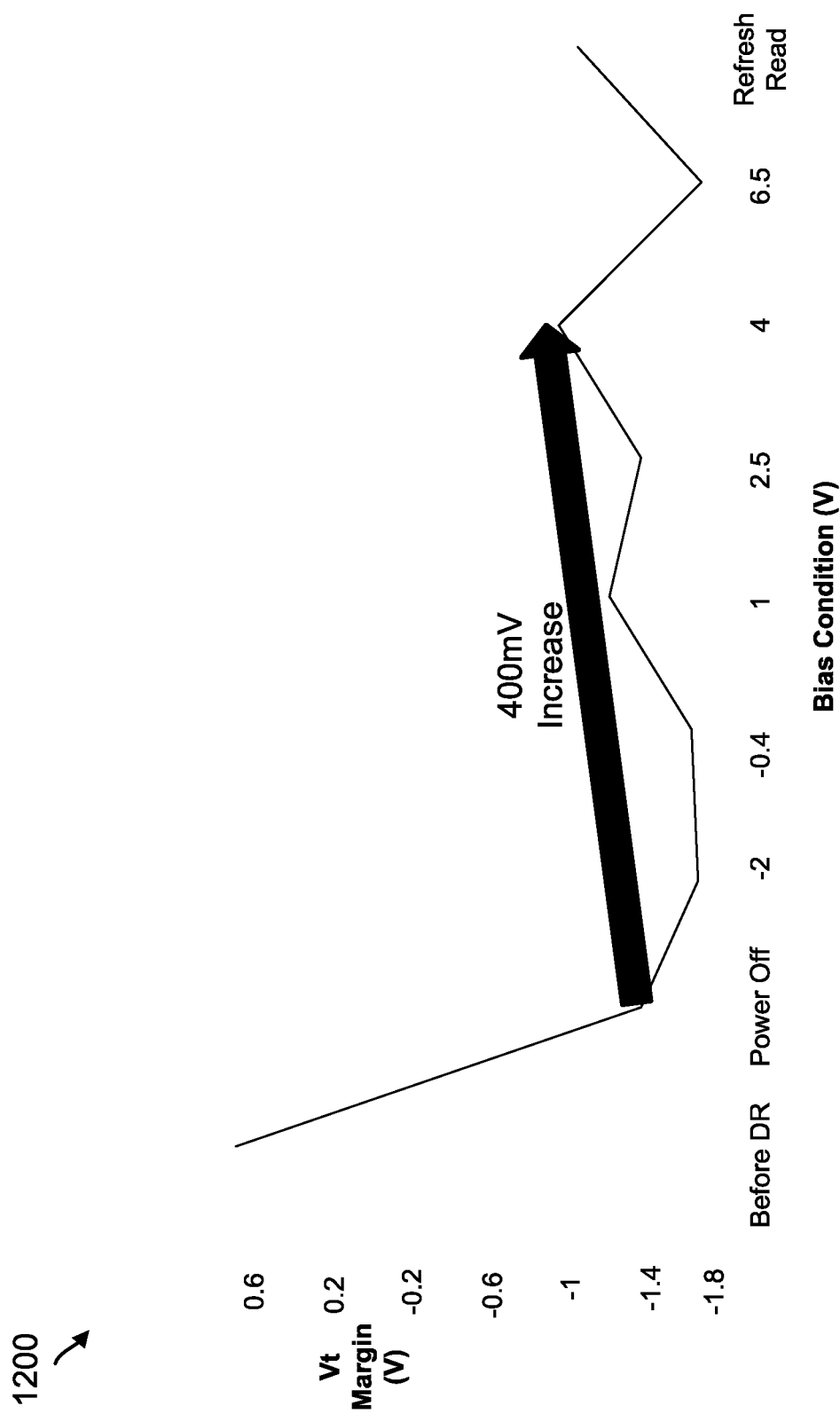
FIG. 12 is a graphical diagram illustrating examples of changes in cell voltage threshold margins in response to different positive, negative and neutral biases applied to the cells.

Thus, in contrast to negative biasing, positive biasing may tighten the Vt distribution width of a given program state, leading to improved Vt margin between different program state distributions. For instance, FIG. 12 illustrates an example 1200 showing a change in Vt margin for different positive bias conditions, where an optimum margin of ~400 mV may be gained in response to application of a constant, 4 V positive bias to the cells. Thus, applying a constant 4 V bias to the cells 116, 302 coupled to word lines 304, 408 in blocks 402 may cause the gap between Vt distributions for each of the program states 504 in FIG. 5 to widen by ~400 mV, resulting in less likelihood of Vt overlap between states.

However, applying a constant bias to the word lines 304, 408 in the blocks 402 may utilize significant power in power-on devices. Moreover, power-off devices may not be capable of implementing constant biasing due to their disconnectable nature. Accordingly, to save system power in power-off devices while maintaining at least a portion of the Vt margin improvement obtained through constant biasing, the controller 123 may apply pulsed biasing to the word lines 304, 408 during power-up. Moreover, to further save system power in power-on devices compared to constant biasing, as well as in power-off devices outside of power-up, the controller 123 may apply pulsed biasing to word lines 304, 408 during read recovery.

Figure 13:
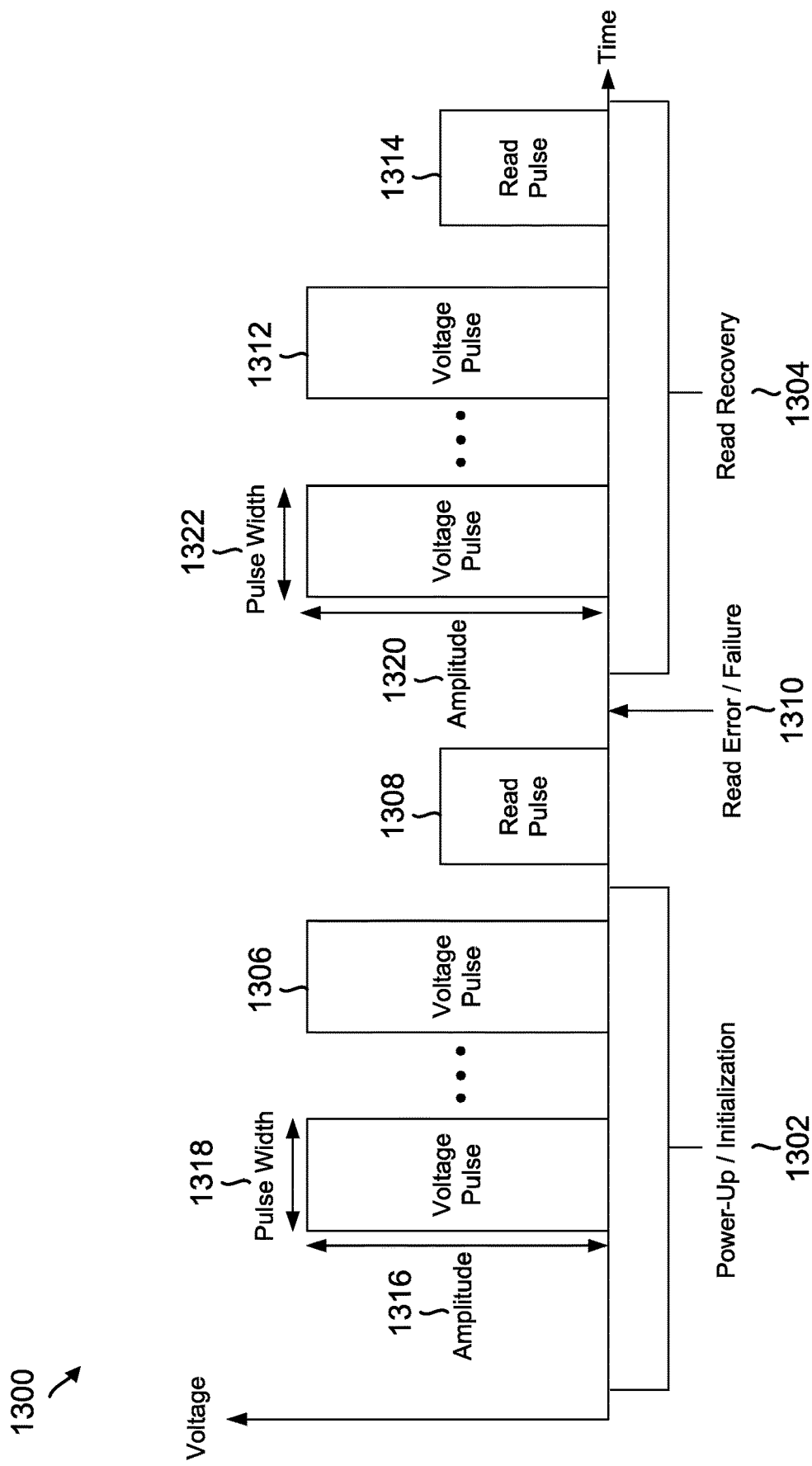
FIG. 13 is a graphical diagram illustrating an example of pulsed bias timing during power-up or read recovery.

FIG. 13 depicts an example 1300 of a timing diagram for pulsed biasing which the controller 123 may apply to word lines 304, 408 during power-up 1302 or read recovery 1304. In one example, during initialization (e.g., on power-up 1302 following removal and re-attachment of the storage device 102 to host 104), the controller 123 may apply one or more voltage pulses 1306 to the word lines 304, 408 to improve or maintain the charge and thus the DR of the cells coupled to those word lines and minimize subsequent read errors. For example, before the controller 123 receives or executes a host command to read data, the controller may apply one or multiple voltage pulses 1306 to the word lines of a block to improve or maintain the cell charge until the controller subsequently applies a read voltage or read pulse 1308 in response to the host command. As a result of this aperiodic application of a positive bias during power-up, an improved Vt margin between program state Vt distributions may result.

In another example shown in FIG. 13, following application of read pulse 1308 in response to a host read command, the controller 123 may detect a read failure or read error 1310. For instance, following a read of data in the cells coupled to a word line, the controller may determine a read error/failure to occur in response to identifying that the read data includes incorrect bits (e.g., a '0' was programmed in multiple cells, but a '1' was read from those cells due to Vt changes resulting from cell charge loss). The controller may also determine a read error/failure to occur in response to identifying that the incorrectly read data is not correctable using parity bits or other error correction capabilities (e.g., if multiple cells on the word line include incorrect bits). If the controller detects a read error/failure in the cells, the controller may perform read recovery 1304 by initially applying one or more voltage pulses 1312 to the word lines 304, 408 to improve the cell charge, and then afterwards retry the read with application of another read pulse 1314. The read pulse 1314 may be the same voltage as the read pulse 1308 previously resulting in the read error. As a result of this aperiodic application of a positive bias during read recovery, an improved Vt margin between program state Vt distributions may result, thereby compensating for the Vt loss in the incorrectly read cells and improving the likelihood of a successful read in response to read pulse 1314. If another read error or failure occurs in response to the read pulse 1314 as well, then the controller 123 may again apply one or more voltage pulses 1312 to the word lines 304, 408 and retry the read as previously described. This process may continue until a successful read is obtained in response to an applied read pulse (e.g., if a read failure or error does not occur in response to the Vt margin improvements).

The controller 123 may apply pulsed biasing solely during power-up 1302, solely during read recovery 1304, or both during power-up and read recovery. During power-up 1302, the controller 123 may configure each of the voltage pulses 1306 with a pulse amplitude 1316 and a pulse width 1318 that provides optimal Vt margin improvement (e.g., a pulse amplitude of 7 V and a pulse width of 1 second for 100 mv in additional Vt margin). While such Vt margin improvement may be smaller than that resulting from constant biasing such as shown in FIG. 12 (e.g., 100 mV<400 mV), the significant power savings of pulsed biasing compared to constant biasing may compensate for this partial improvement. Similarly, during read recovery 1304, the controller 123 may configure each of the voltage pulses 1312 with a pulse amplitude 1320 and a pulse width 1322 that provides similar optimal Vt margin improvement. For example, the pulse amplitude 1320 or pulse width 1322 configured for voltage pulse(s) 1312 during read recovery may respectively be the same as the pulse amplitude 1316 or pulse width 1318 configured for voltage pulse(s) 1306 during power-up. Alternatively, the pulse amplitude 1320 or pulse width 1322 configured for read recovery may respectively be different from the pulse amplitude 1316 or pulse width 1318 configured for power-up. Moreover, if multiple voltage pulses 1306 or voltage pulses 1312 are applied during power-up or read recovery, each one of the voltage pulses (or multiple ones of the voltage pulses) may have a same pulse amplitude, a same pulse width, a different pulse amplitude, or a different pulse width. Thus, the controller 123 may determine to apply one or multiple voltage pulses 1306, 1312 during power-up, read recovery, or both, with different combinations of configurable pulse amplitudes and pulse widths. In this way, flexibility in the amount of obtainable Vt margin improvement may be achieved through different configurations of pulsed biasing.

Additionally, the controller 123 may configure the pulse amplitude 1316, 1320 or pulse width 1318, 1322 of each voltage pulse 1306, 1312 depending on a number of P/E cycles of the block 402 including the word lines 304, 408 to which pulsed biasing is to be applied. For instance, during power-up 1302 or read recovery 1304 (or both), the controller 123 may configure higher pulse amplitudes, longer pulse widths, or both, for voltage pulses applied to word lines in blocks 402 having more P/E cycles (e.g. 2K), while configuring lower pulse amplitudes, shorter pulse widths, or both, for voltage pulses applied to word lines in blocks 402 having less P/E cycles (e.g., 1K). For example, in blocks having 1K P/E cycles, the controller may apply one or more voltage pulses having a 7 V pulse amplitude and a 1 second pulse width, while in blocks having 2K P/E cycles, the controller may apply one or more voltage pulses having a 7.5 V pulse amplitude and a 1 second pulse width, a 7 V pulse amplitude and a 1.5 second pulse width, or a 7.5 V pulse amplitude and a 1.5 second pulse width. The controller may configure other pulse amplitudes or pulse widths in other examples. By varying the pulse amplitude or pulse width depending on the number of P/E cycles, the controller may compensate for the different amounts of cell charge loss which may result from the different P/E cycles of the various blocks, and thus achieve corresponding improvements in Vt margins within those various blocks.

Figure 14:
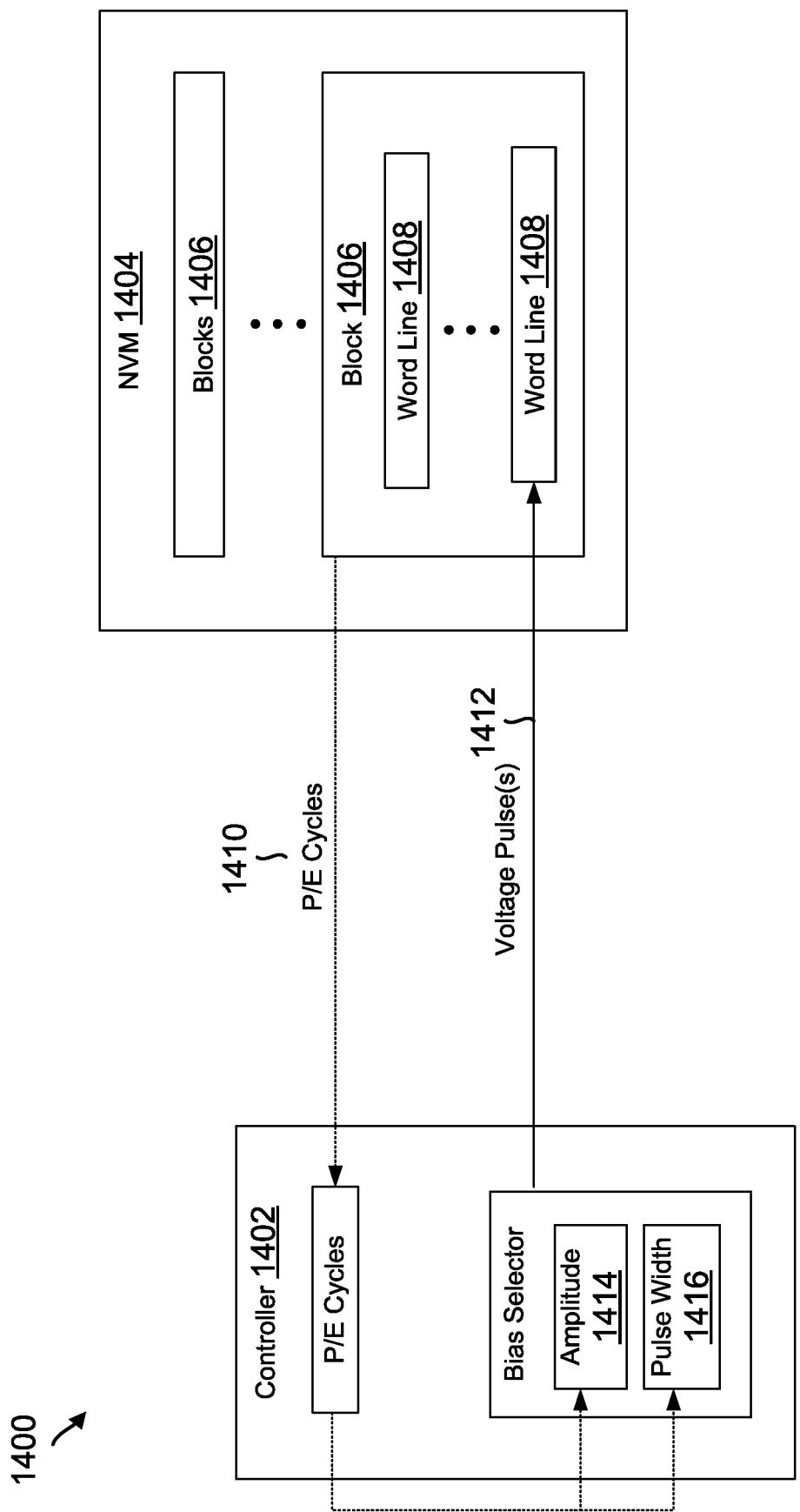
FIG. 14 is a conceptual diagram illustrating an example of pulsed biasing performed by a controller in the storage device of FIG. 1.

FIG. 14 illustrates an example 1400 of a controller 1402 which performs pulsed biasing in an NVM 1404. The NVM 1404 includes blocks 1406, and each of the blocks includes cells coupled to word lines 1408. Controller 1402 may correspond to controller 123 of FIG. 1, NVM 1404 may correspond to NVM 110 of FIG. 1, blocks 1406 may correspond to blocks 402 of FIG. 4, and word lines 1408 may correspond to word lines 304, 408 of FIGS. 3 and 4 respectively. The controller 1402 may track a number of P/E cycles 1410 of each of the blocks 1406. For example, after the controller programs data in one or more cells of one of the blocks 1406, and subsequently erases the data programmed in that block, the controller may update a number of P/E cycles for that block. The controller may track P/E cycles similarly for each block and may store the numbers of P/E cycles for the blocks in volatile memory or in the NVM 110.

During power-up (e.g., power-up 1302), read recovery (e.g., read recovery 1304), or both, the controller 1402 may apply one or more voltage pulses 1412 (e.g., voltage pulses 1306, 1312) to the word lines 1408 in one or more of the blocks 1406. The voltage pulses may result in increased Vt margin between cell Vt distributions of adjacent program states, thereby minimizing the likelihood of read errors following power-up or read recovery. Moreover, the controller 1402 (or a bias selector module of the controller) may select a pulse amplitude 1414 (e.g., pulse amplitude 1316, 1320) and a pulse width 1416 (e.g., pulse width 1318, 1322) for each of the voltage pulse(s) 1412 applied to the word lines 1408. The pulse amplitude 1414 or pulse width 1416 of each voltage pulse applied in a block may be a function of the number of P/E cycles 1410 associated with that block. For instance, in response to determining that a first block has one number of P/E cycles, the controller or bias selector module may select one pulse amplitude, one pulse width, or both for a voltage pulse applied to a word line in that block, and in response to determining that a second block has a different number of P/E cycles, the controller or bias selector module may select another pulse amplitude, another pulse width, or both for a voltage pulse applied to a word line in that other block. The bias selector module may be implemented, for instance, with a voltage source controlled to output different voltages based on software mapping different numbers of P/E cycles to different pulse amplitudes or pulse widths, or in some other manner in hardware, software, or a combination of hardware and software. In this way, different amounts of Vt margin improvement may be achieved during power-up or read recovery through P/E cycle-dependent pulsed biasing.

Figure 15:
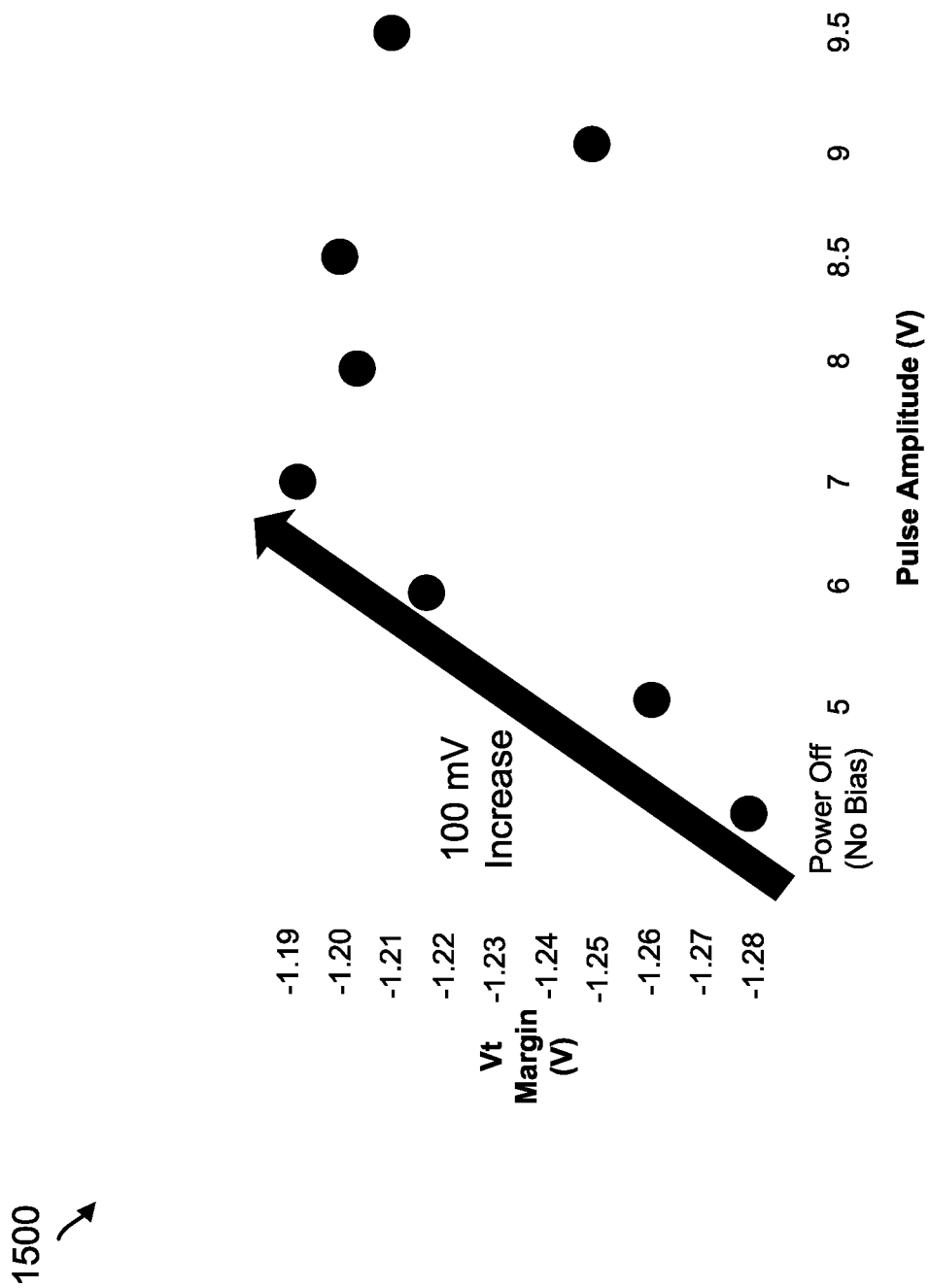
FIG. 15 is a graphical diagram illustrating an example of changes in cell voltage threshold margins in response to different pulsed bias amplitudes applied to the cells.

FIG. 15 illustrates an example 1500 of a graph showing a change in cell voltage threshold margins in response to different pulsed bias amplitudes applied to the cells over a common pulse width. In the illustrated example, the controller may determine for a given block that a maximum Vt margin improvement (e.g., 100 mV) with respect to a power-off state may be achieved when the controller applies voltage pulses to a word line with a pulse amplitude of 7 V (over a pulse width of 1 second). Thus, in this example, for a given block, the controller may identify 7 V as the optimal pulsed bias amplitude for a pulse width of 1 second. In other examples or blocks, the controller may determine other optimal pulse amplitudes or pulse widths which provide maximum Vt margin improvement. Upon determining the optimal pulse amplitude or pulse width for a given block, the controller may apply voltage pulse(s) to the word lines of that block with these characteristics accordingly in order to achieve maximum DR benefit. Moreover, in other examples, the controller may apply voltage pulse(s) with other pulse amplitudes or pulse widths (other than that considered optimal), since some DR benefit may still be achieved. Furthermore, to prevent program disturb effects, the controller may limit the pulse amplitude(s) or pulse width(s) configurable for a voltage pulse. For instance, in the illustrated example, a pulse amplitude of 9 V may result in unintended transitions of cells from the erase state (e.g., erase state 502 in FIG. 5) to the A program state (e.g., the first one of the program states 504 in FIG. 5), thereby significantly degrading the Vt margin improvement. Thus, in this example, the controller may refrain from applying voltage pulses with 9 V (or other voltages) to prevent inadvertent erase-A state transitions.

Figure 16:
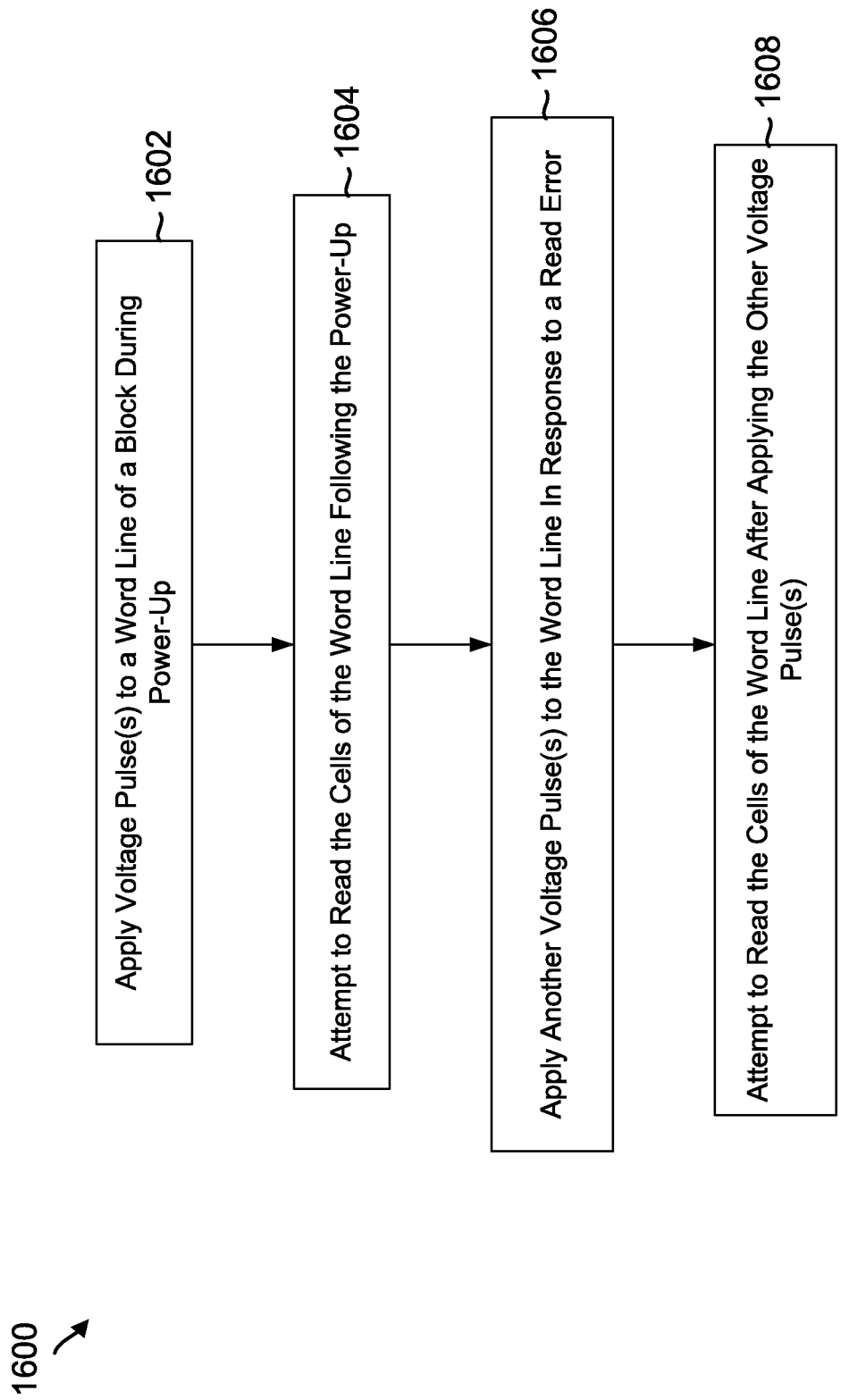
FIG. 16 is a flow chart illustrating an example of a method for performing pulsed biasing during power-up or read recovery, as performed by the storage device of FIG. 1.

FIG. 16 illustrates an example flow chart 1600 of a method for performing pulsed biasing during power-up or read recovery. For example, the method can be carried out in a storage device 102 such as the one illustrated in FIG. 1. Each of the steps in the flow chart can be controlled using the controller as described below (e.g. controller 123, 1402), by a component or module of the controller, or by some other suitable means.

As represented by block 1602, the controller may apply one or more voltage pulse(s) to a word line of a block during power-up. For instance, referring to the aforementioned figures, the controller 123, 1402 may apply one or more voltage pulses 1306, 1312, 1412 to word line 304, 408, 1408 of block 402, 1406 during power-up 1302.

As represented by block 1604, the controller may attempt to read the cells of the word line following the power-up. For instance, referring to the aforementioned figures, the controller 123, 1402 may attempt to read the cells 116, 302 coupled to the word line 304, 408, 1408 following power-up 1302. For example, when attempting to read the cells on a word line, the controller may apply read pulse 1308 (e.g., a read voltage) to the word line, determine the read state of the cells (e.g., logic '0' or logic '1'), and identify whether a read error has occurred. For instance, the controller may check whether the read data includes incorrect bits (e.g., a '0' was programmed in multiple cells, but a '1' was read from those cells due to Vt changes resulting from cell charge loss), or whether the incorrectly read data is not correctable using parity bits or other error correction capabilities (e.g., if multiple cells on the word line include incorrect bits). If incorrect bits are identified, controller may determine that a read error or read failure has occurred, and thus the read attempt failed. Otherwise, the controller may successfully return the correctly read data to the host.

As represented by block 1606, the controller may apply another voltage pulse(s) to the word line in response to a read error. For instance, referring to the aforementioned figures, the controller 123, 1402 may apply one or more voltage pulse(s) 1312 to the word line 304, 408, 1408 in response to the read error 1310 determined at 1604. For example, the controller may apply the voltage pulse(s) 1312 during read recovery 1304 following determination of read error 1310.

Finally, as represented by block 1608, the controller may attempt to read the cells of the word line after applying the other voltage pulse(s) at 1606. For instance, referring to the aforementioned figures, the controller 123, 1402 may attempt to read the cells 116, 302 coupled to the word line 304, 408, 1408 after applying the one or more voltage pulse(s) 1312 during read recovery 1304. For example, when attempting to read the cells on the word line, the controller may apply read pulse 1314 (e.g., a same read voltage as read pulse 1308) to the word line, again determine the read state of the cells, and again identify whether a read error has occurred (such as described above with respect to block 1604).

Figure 17:
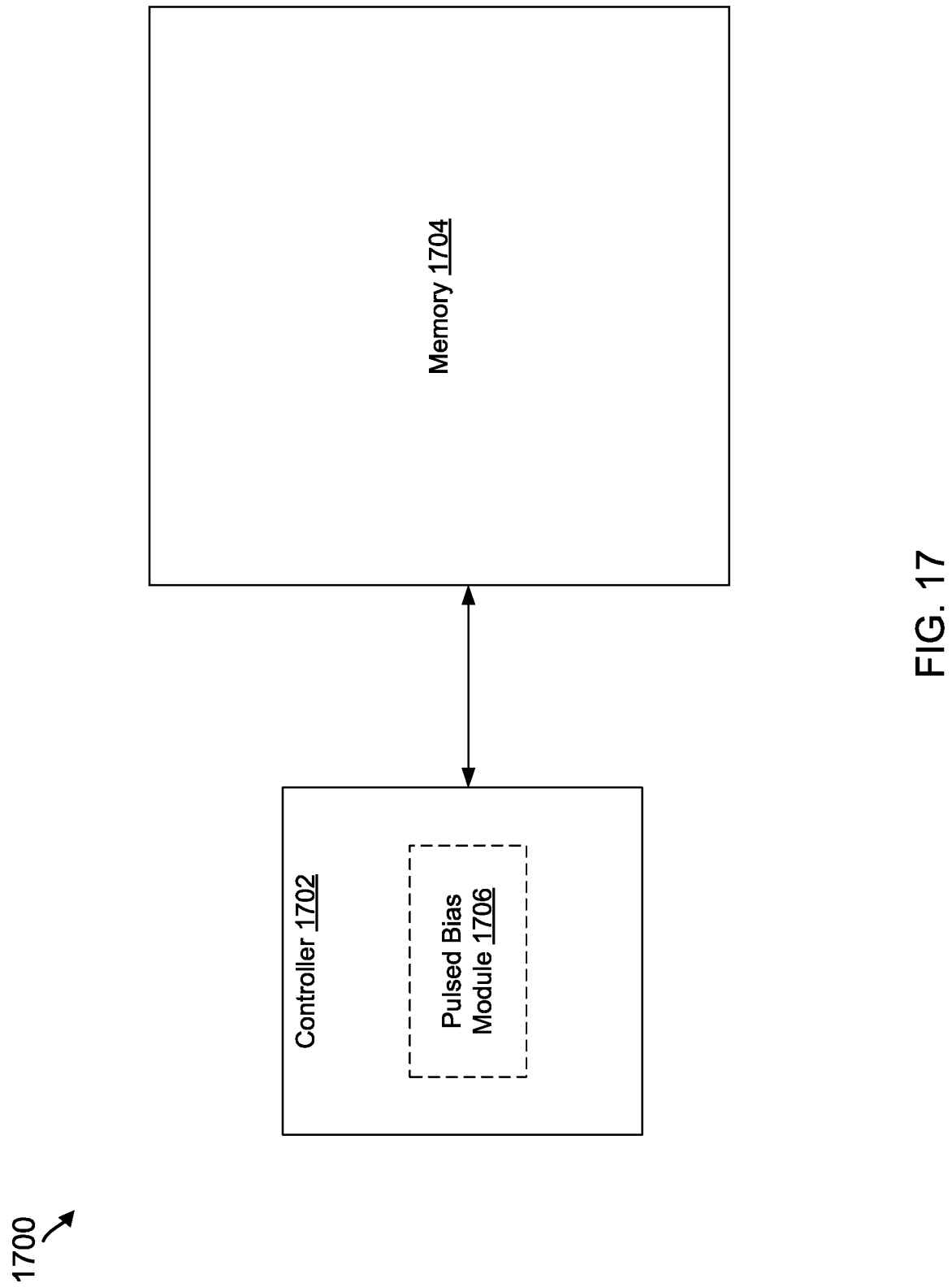
FIG. 17 is a conceptual diagram illustrating an example of a controller that performs pulsed biasing during power-up or read recovery in the storage device of FIG. 1.

FIG. 17 is a conceptual diagram illustrating an example 1700 of a controller 1702 coupled to a memory 1704 in a storage device. For example, controller 1702 may correspond to controller 123, 1402 and memory 1704 may correspond to the NVM 110, 1404 of the storage device 102 in FIGS. 1 and 14. The controller may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

In one example, the controller 1702 includes a pulsed bias module 1706 that may provide a means for applying a voltage pulse to a word line during power-up, a means for applying a voltage pulse to a word line in response to a read error, or a means for applying one or more first voltage pulses to a word line during power-up and one or more second voltage pulses to the word line in response to a read error. For example, the pulsed bias module 1706 may perform the process or algorithm described above with respect to FIGS. 14 and 16.

Thus, the controller of the present disclosure may apply pulsed biasing to recover Vt margin between program state Vt distributions and improve DR. While the Vt margin improvement resulting from pulsed biasing may be a portion of that resulting from constant biasing (e.g., 100 mV from pulsed biasing <400 mV from constant biasing), pulsed biasing may provide more power savings as well as simpler implementation than constant biasing (e.g., without as complex circuitry). Moreover, pulsed biasing may be applied to power-off systems, in contrast to constant biasing. Additionally, while the application of pulsed biasing during read recovery may increase its duration (e.g., the read retry period may be lengthened at least by the time of a pulse width), the improved reliability of data and reduced read errors resulting from pulsed biasing may balance such lengthening of read retry time.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a memory including a block, the block having a word line and a plurality of cells coupled to the word line; and
   a controller configured to apply multiple voltage pulses to the word line during power-up.

2. The storage device of claim 1, wherein the controller is configured to apply the multiple voltage pulses to the word line during the power-up prior to executing a host command.

3. The storage device of claim 1, wherein the controller is configured to attempt to read the cells following the power-up, and to apply another voltage pulse to the word line in response to a read failure.

4. The storage device of claim 3, wherein the another voltage pulse includes an amplitude that is a function of a number of program/erase (P/E) cycles of the block.

5. The storage device of claim 3, wherein the another voltage pulse includes a pulse width that is a function of a number of program/erase (P/E) cycles of the block.

6. The storage device of claim 3, wherein the controller is configured to apply multiple ones of the another voltage pulse in response to the read failure, and to attempt to read the cells after applying the multiple ones of the another voltage pulse.

7. The storage device of claim 6, wherein each of the multiple ones of the another voltage pulse includes an amplitude that is a function of a number of program/erase (P/E) cycles of the block.

8. The storage device of claim 6, wherein each of the multiple ones of the another voltage pulse includes a pulse width that is a function of a number of program/erase (P/E) cycles of the block.

9. A storage device, comprising:
   a memory including a block, the block having a word line and a plurality of cells coupled to the word line; and
   a controller configured to apply a voltage pulse to the word line in response to a read error, wherein the voltage pulse includes an amplitude and a pulse width that are each a function of a number of program/erase (P/E) cycles of the block.

10. The storage device of claim 9, wherein the controller is configured to apply multiple ones of the voltage pulse to the word line in response to the read error.

11. The storage device of claim 10, wherein the amplitude of each of the multiple ones of the voltage pulse is a function of the number of P/E cycles of the block.

12. The storage device of claim 10, wherein the pulse width of each of the multiple ones of the voltage pulse is a function of the number of P/E cycles of the block.

13. The storage device of claim 9, wherein the controller is configured to apply another voltage pulse to the word line during initialization.

14. The storage device of claim 13, wherein the another voltage pulse includes an amplitude that is a function of the number of P/E cycles of the block.

15. The storage device of claim 13, wherein the another voltage pulse includes a pulse width that is a function of the number of P/E cycles of the block.

16. The storage device of claim 13, wherein the controller is configured to apply multiples ones of the another voltage pulse during the initialization.

17. The storage device of claim 16, wherein each of the multiple ones of the another voltage pulse includes an amplitude and a pulse width that are a function of the number of P/E cycles of the block.

18. A storage device, comprising:
   a memory including a block, the block having a word line and a plurality of cells coupled to the word line; and
   a controller configured to apply one or more first voltage pulses to the word line during power-up and to apply one or more second voltage pulses to the word line in response to a read error.

19. The storage device of claim 18, wherein the one or more first voltage pulses each include an amplitude and a pulse width that are a function of a number of program/erase (P/E) cycles of the block.

20. The storage device of claim 18, wherein the one or more second voltage pulses each include an amplitude and a pulse width that are a function of a number of program/erase (P/E) cycles of the block.

* * * * *